Dec. 5, 1972 F. STORK 3,705,060

METHOD OF PRODUCING A SEMICONDUCTOR OR THICK FILM DEVICE

Filed Dec. 1. 1969 5 Sheets-Sheet 1

Inventor:
Fritz Stork
BY Spencer & Kaye
ATTORNEYS.

Inventor:
Fritz Stork
BY Spencer & Kaye
ATTORNEYS.

Dec. 5, 1972 F. STORK 3,705,060

METHOD OF PRODUCING A SEMICONDUCTOR OR THICK FILM DEVICE

Filed Dec. 1, 1969 5 Sheets-Sheet 3

Inventor:
Fritz Stork

BY Spencer & Kaye
ATTORNEYS.

METHOD OF PRODUCING A SEMICONDUCTOR OR THICK FILM DEVICE

Filed Dec. 1, 1969

Inventor:
Fritz Stork
BY Spencer & Kaye
ATTORNEYS.

METHOD OF PRODUCING A SEMICONDUCTOR OR THICK FILM DEVICE

Filed Dec. 1, 1969 5 Sheets-Sheet 5

Inventor:
Fritz Stork
BY Spencer & Kaye
ATTORNEYS.

3,705,060

METHOD OF PRODUCING A SEMICONDUCTOR OR THICK FILM DEVICE

Fritz Stork, Grossgartach, Germany, assignor to Telefunken Patentverwertungsgesellschaft m.b.H., Ulm-Donau, Germany Filed Dec. 1, 1969, Ser. No. 881,150
Claims priority, application Germany, Dec. 2, 1968, P 18 12 130.7
Int. Cl. B32b *31/14*; B44c *1/22*
U.S. Cl. 156—3 14 Claims

ABSTRACT OF THE DISCLOSURE

A method of producing a semiconductor or thick film device comprises forming a layer of etching resistant, temperature resistant and light insensitive plastics material on a carrier body, such as an insulating material or semiconductor body and removing predetermined areas of the plastics layer by means of a controlled electron beam. The areas of the carrier body from which the plastics material has been removed can be used for the removal of further material, depositing further material or the introduction of further material.

BACKGROUND OF THE INVENTION

The invention relates to a method of producing a semiconductor or thick-film device, for the manufacture of which one surface of a carrier member is to be provided with a masking layer containing specific structures or recesses.

The microminiaturisation of components and circuits is acquiring ever greater importance in electrical engineering. The manufacture of transistors, diodes, integrated semiconductor circuits, thick-film and thin-film circuits can only be carried out with special aids. One of these aids is the so-called masking and etching technique. When regions of a specific type of conductivity have to be diffused into specific surface areas of a semiconductor body for example, the semiconductor surface must first be covered with a diffusion-inhibiting layer, which may consist of an oxide for example. Apertures are introduced into this oxide layer at specific points. For this purpose, in the known technique, the oxide layer is covered with a light-sensitive layer of photolacquer which is exposed and developed by means of a prefabricated photomask in such a manner that the photolacquer, which is resistant to etching, only remains over the parts of the oxide layer which are not to be removed. The remaining surface areas of the oxide layer are exposed by the development of the photolacquer layer and can now easily be removed in an etching solution. Impurities are then diffused, from the gaseous phase for example, into the exposed areas of the semiconductor surface through these apertures in the oxide layer and form regions of specific types of conductivity in the semiconductor body. The technique described is also used for the structuring of metal layers, for example of the production of conducting paths on insulating or semiconductor bodies. For the partial deposition of epitaxial layers, an insulating layer on the semiconductor surface is likewise structured by means of the known masking and etching technique.

Conducting paths on semiconductor surfaces or bodies of insulating material should have as low a resistance as possible. For this reason, the conducting paths, which are generally vapour-deposited, electro-deposited or deposited without current, are made as wide as possible. Limits are imposed on this widening of the conducting paths, however, by the area available. Particularly in integrated circuits or in integrated large circuits which consist of a plurality of basic circuits to be electrically interconnected, a very large number of conducting paths are needed for the interconnection of the individual components so that the electrical wiring of the circuit either has to be executed in various planes or the conducting paths have to be constructed very narrow. The production of different wiring planes separated from one another by layers of insulating material is technically difficult and expensive.

SUMMARY OF THE INVENTION

It is an object of the invention to improve the known masking and etching technique.

According to the invention, there is provided a method of producing a semiconductor or thick film device including the steps of forming a layer of plastics material which is resistant to etching, temperature resistant and insensitive to light on a carrier body, guiding an electron beam over said plastics layer, controlling said beam so as to remove predetermined areas of said plastics layer for forming apertures in the plastics layer, and passing material through the region of the apertures to the carrier body.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figure 1:
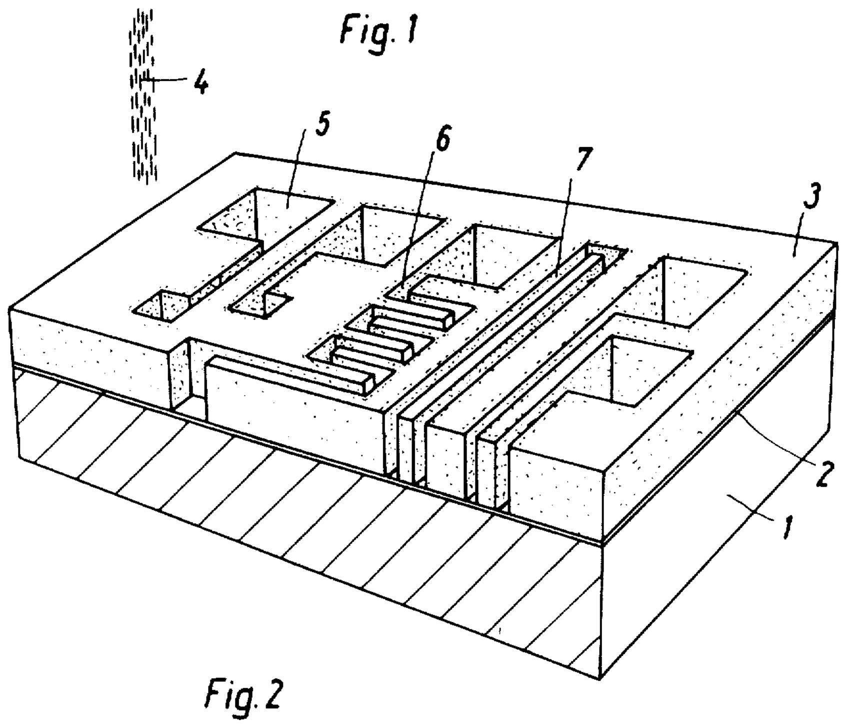
FIG. 1 shows in a perspective view, partly in section, one stage in the production of a thick-film circuit provided on an insulating carrier body in accordance with the invention.

Basically, the invention proposes that, in order to produce the masking layer, a layer of plastics material which is resistant to etching, resistant to temperature and insensitive to light should be applied to one surface of the carrier member, that an electron beam should be guided and controlled over this plastics layer in such a manner that predetermined areas of the plastics layer are removed, and that finally further material should be removed, deposited and/or introduced into the carrier member in the exposed areas of the carrier surface.

The use of layers of plastics has the advantage that these are resistant to etching and can be made very thick. The thickness of these plastics layers may be between one μm. and a few tenths of a mm. Tetrafluoroethylene or polyurethane for example are suitable as plastics materials which are preferably sprayed on the semiconductor or insulating body. The method according to the invention is particularly suitable for the production of very narrow but thick conducting paths which have a very low resistance because of their considerable thickness.

A semiconductor body or a body of an insulating material is used for example as a carrier body for the production of a thick-film circuit. A thin metallic layer is applied to one surface of this carrier body and is subsequently covered with a layer of plastics material. Specific areas of this layer of plastics material are then removed again by means of an electron beam so that further metal can be electro-deposited or deposited without current on the areas of the thin metal layer thus exposed. This deposition process is continued until the apertures in the plastics layer are entirely or partially filled with metal.

In order to produce conducting paths on a semiconductor body containing at least one semiconductor component, in carrying out the method according to the invention, one surface of the semiconductor body is covered with an oxide or nitride layer. Apertures are formed in this diffusion-inhibiting layer, over the surface areas provided for the contacts. Then the oxide or nitride layer and the exposed areas of the semiconductor surface are coated with a thin layer of metal and the metal layer is in turn coated with a relatively thick layer of plastics material. The layer of plastics material is then removed by means of an electron beam in the surface areas provided for the contacts and conducting paths so that the recesses and channels produced in the layer of plastics material can finally be filled in with the material for the conducting paths or contacts by electro-deposition or currentless deposition.

In order to produce partial epitaxial layers by the method according to the invention, a semiconductor body having a specific type of conductivity is covered with an oxide layer or a nitride layer and this diffusion-inhibiting layer is in turn covered with a layer of plastics material. Then recesses are formed in the plastics layer, extending as far as the oxide or nitride layer, by means of a controllable electron beam. The exposed portions of the oxide or nitride layer are removed by means of the etching technique known per se and the recesses provided for the reception of the partial epitaxial semiconductor regions are formed in the semiconductor body. Finally, the layer of plastics material is again removed and the recesses are again filled wholly or partially with semiconductor material by an epitaxial deposition process.

Referring now to FIG. 1 there is shown in perspective view, a portion of an insulating carrier body 1 which consists of ceramic or glass for example. One surface of this carrier body is coated with a metal layer 2, which consists of copper for example, about 500 to 1000 A. thick. This metal layer 2 is preferably vapour-deposited on the carrier body. Finally, a plastics layer 3 of tetrafluoroethylene or polyurethane 20 μm. thick is sprayed on to the metal layer. An electron beam 4 is guided over the plastics layer 3 in such a manner that specific, sharply defined regions of the plastics layer are heated and evaporated. In the course of this, it has proved possible and advantageous to control the cross-section, the radiation intensity, the periodic rhythm of radiation times and intervals, and the movement of the electron beam by means of a programmed computer. The channels 6 and 7 and recesses 5 introduced into the plastics layer and extending as far as the metal layer have for example the structure of serpentine resistance paths, conducting paths and connecting contacts. By means of an electron beam, it is possible to form channels in the plastics layer which are only a few μm. wide and are only separated from an adjacent channel by a few μm. The channels and recesses in the plastics layer illustrated in FIG. 1 can be filled in completely or partially with metal, for example with copper, by currentless or electrodeposition. In this manner, numerous conducting paths and contacts can be produced in the minimum space and have a very low resistance because of their thickness of about 20 μm.

Figure 2:
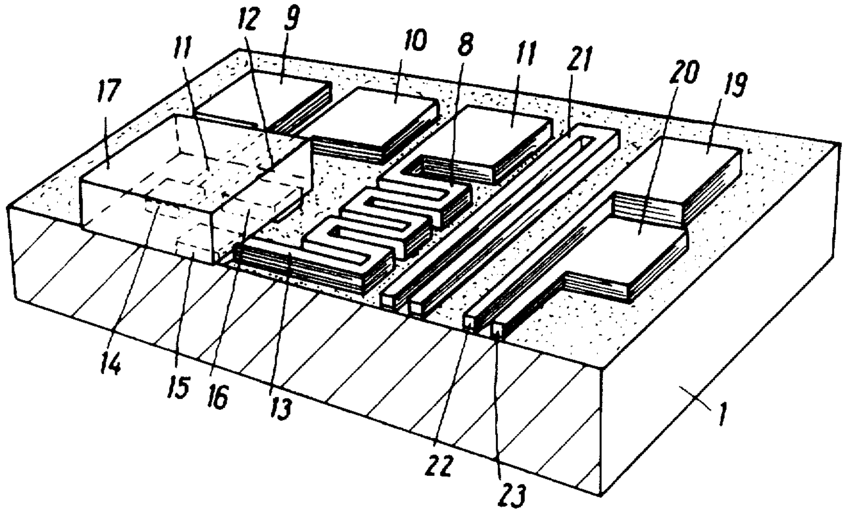
FIG. 2 is a view similar to FIG. 1 but showing a further production stage.

The finished thick-film device is illustrated in FIG. 2 after the plastics layer 3 has been removed again in a suitable solvent following on the currentless deposition of metal. Conducting paths 11 to 13 lead from the serpentine resistance path 8 and from each of the broad-area contacts 9 and 10 to a small-area contact 14 to 16. The last three connecting contacts referred to are so arranged that when a semiconductor component is superimposed, for example a planar transistor 17, the electrodes of this transistor come into contact with the connecting contacts 14 to 16. By heating the device illustrated, the transistor contacts can be rigidly connected to the electrical connecting contacts on the insulating carrier body. The thick-film device shown in FIG. 2 comprises further contacts 18, 19 and 20 as well as conducting paths 21 to 23. In order to separate the individual conducting paths and connecting contacts electrically from one another, the thick-film device illustrated in FIG. 2 is dipped, before the insertion of the semiconductor component, in an etching solution in which the thin metal layer 2 (FIG. 1), which is still present between the conducting paths and contacts, is removed.

Figure 3:
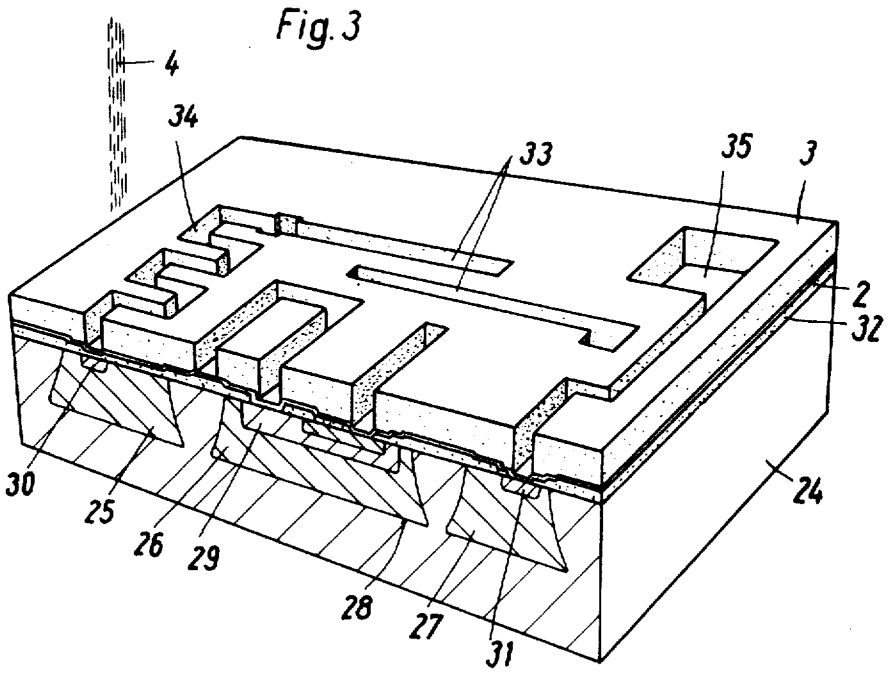
FIG. 3 shows in perspective view, partly in section, one stage in the production of an integrated semiconductor circuit with conducting paths extending over the semiconductor surface in accordance with the invention.
Figure 4:
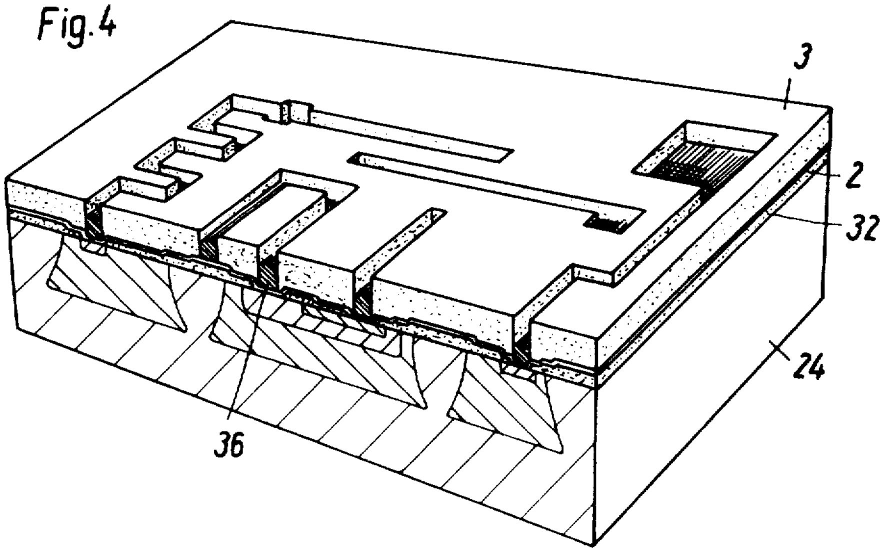
FIG. 4 is a view similar to FIG. 3 but showing a further production stage.

The production of conducting paths in integrated semiconductor circuits is explained with reference to FIGS. 3 to 5. FIG. 3 shows, partially in section, partially in perspective view, a semiconductor body 24 of the first type of conductivity, for example of silicon, in which three semiconductor regions 25 to 27 of the second type of conductivity are disposed, insulated from one another. These three regions are surrounded by barrier layers 28 which extend to one surface of the semiconductor body. Further regions, which form a transistor 29, a diode 30 or a diffused resistor 31 for example, are introduced into the individual semiconductor regions 25 to 27, by means of the known planar technique. The semiconductor surface is covered with a layer of silicon dioxide 32 for example, which is completed afresh and structured according to the requirements during each of the operational steps which are necessary for producing said regions. Finally, contact-making windows are formed above the various semiconductor regions by means of the known photolacquer, masking and etching technique, in the oxide layer 32. The regions of the semiconductor surface exposed in the contact-making windows and the oxide layer are then coated with a thin metal layer 2 and the metal layer is in turn coated with a thicker layer of plastics 3. Linear and serpentine channels 33 and 34 respectively as well as broad-area recesses 35 are formed in the plastics layer 3 by means of an electron beam 4. The apertures in the plastics layer extending as far as the thin metal layer 2 are finally filled in wholly or partially with the contact or conducting-path metal 36, as FIG. 4 shows.

Figure 5:
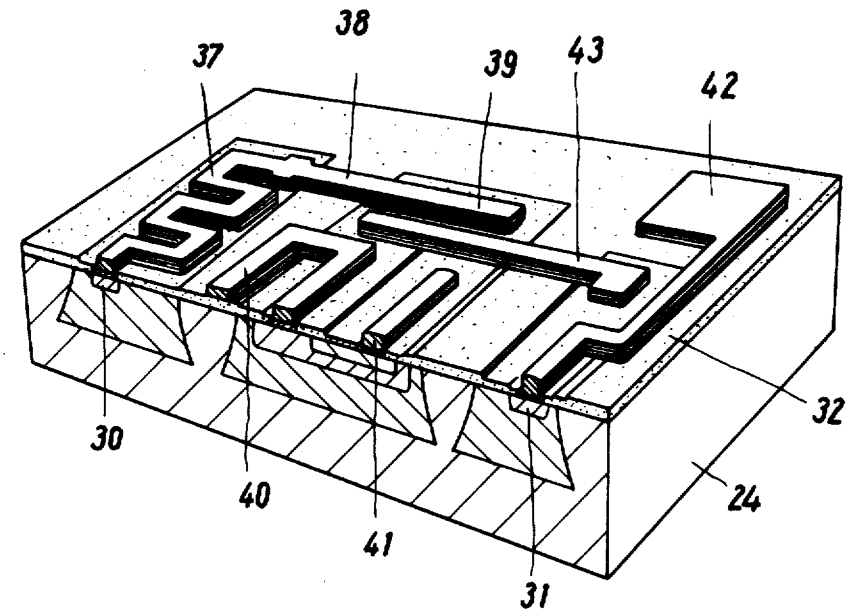
FIG. 5 is a view similar to FIG. 3, but showing the completed circuit.
Figure 6:
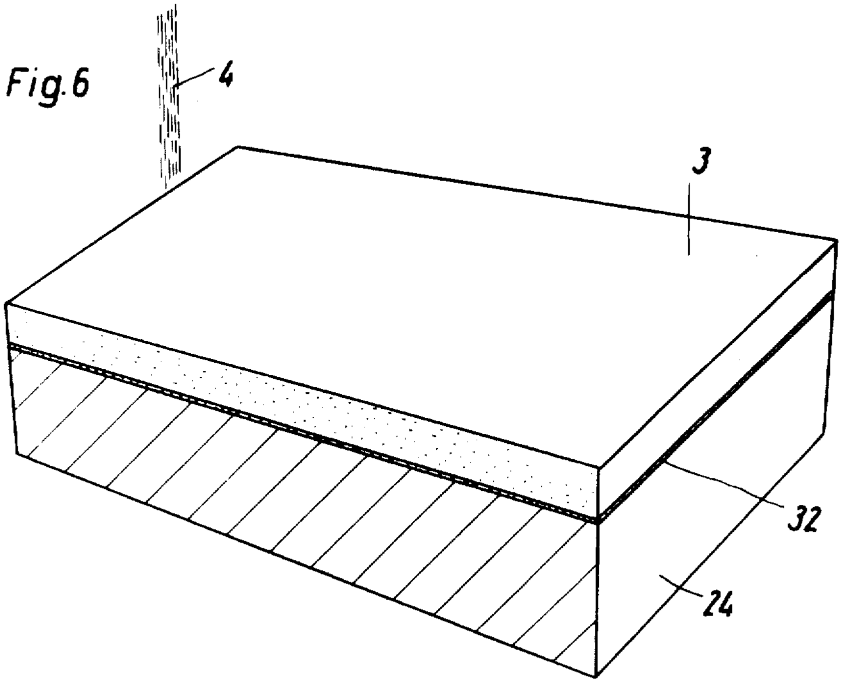
FIG. 6 shows in perspective view, partly in section one stage in the production of partial epitaxial semiconductor regions in accordance with the invention.

FIG. 5 shows, partially in section, partially in a perspective view, a portion of the finished semiconductor device after the plastics layer 3 and the thin metal layer 2 have been removed again in suitable solutions. A serpentine resistance path 37, which is connected through a conducting path 38 to the collector contact 39 of the transistor, extends from a diode contact of the diode 31 over the oxide layer 32. The base contact of the transistor, and the emitter contact are constructed in the form of a conducting path 40 or 41 respectively extending over the oxide layer. The indiffused resistor 31 is, on the one hand electrically connected to a broad-area connecting contact 42 which is on the oxide layer, while the second resistor contact is likewise connected to the collector region 26 of the transistor through a conducting path 43 extending over the oxide layer.

Figure 7:
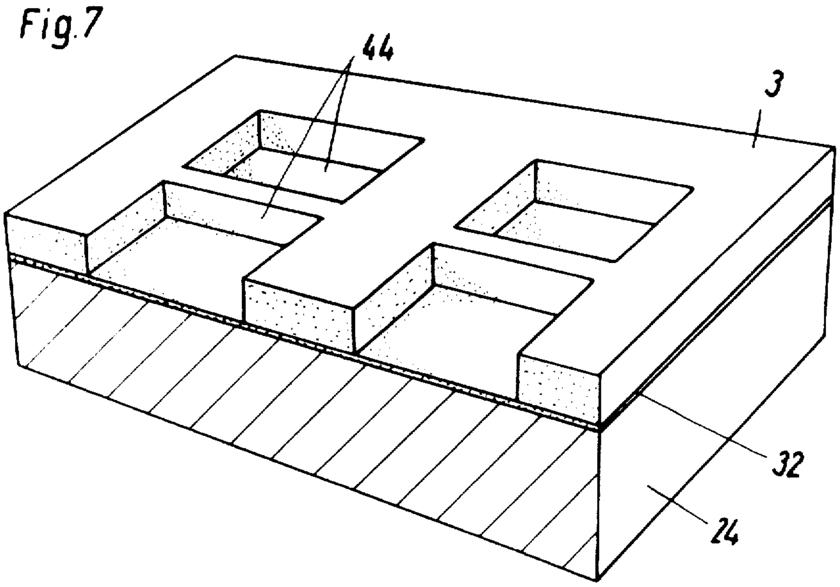
FIG. 7 is a view similar to FIG. 6, but showing a second production stage.
Figure 8:
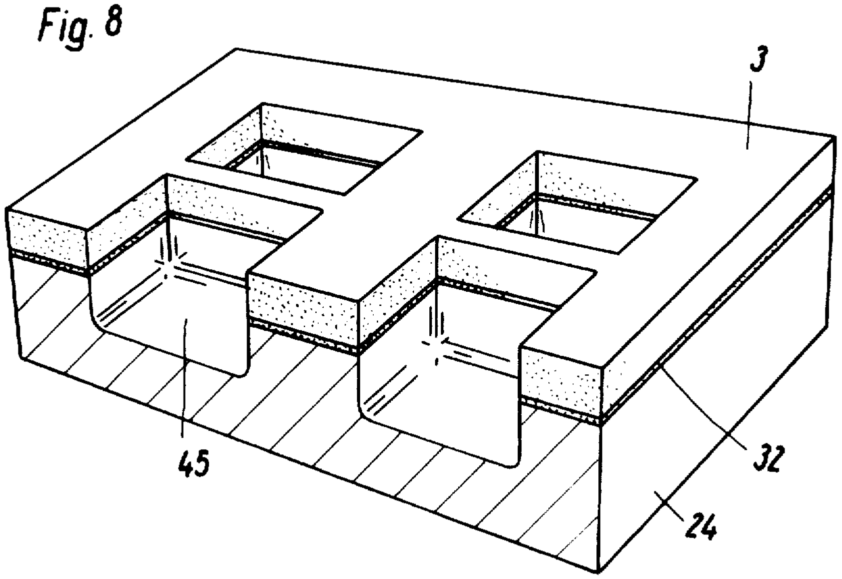
FIG. 8 is a view similar to FIG. 6, but showing a third production stage.

The partial epitaxial deposition by means of the method according to the invention is explained with reference to FIGS. 6 to 9. A plastics layer 3 of tetrafluoroethylene or polyurethane 1 to 10μ thick for example is sprayed on to a semiconductor body 24 of a specific type of conductivity consisting for example of monocrystalline silicon, over the silicon dioxide layer 32 covering one surface of the semiconductor body. Then predetermined portions of the plastics layer are removed again down to the oxide layer by means of an electron beam 4, as FIG. 7 shows. Thus for example rectangular windows 44 are formed in the plastics layer. The portions of the oxide layer thus exposed are etched away, for example in buffered hydrofluoric acid, as shown in FIG. 8. In a further etching process, which is carried out for example in a solution of hydrofluoric and nitric acid, recesses 45 are formed in the semiconductor body wherever the semiconductor surface is exposed without protection to the etchant. These recesses extend for example a few μm. into the semiconductor body. Since the masking layer 3 of plastics material on the semiconductor surface is very resistant to etching, the etching period can be selected as long as desired. There is no risk of the plastics layer being removed or dissolved.

Figure 9:
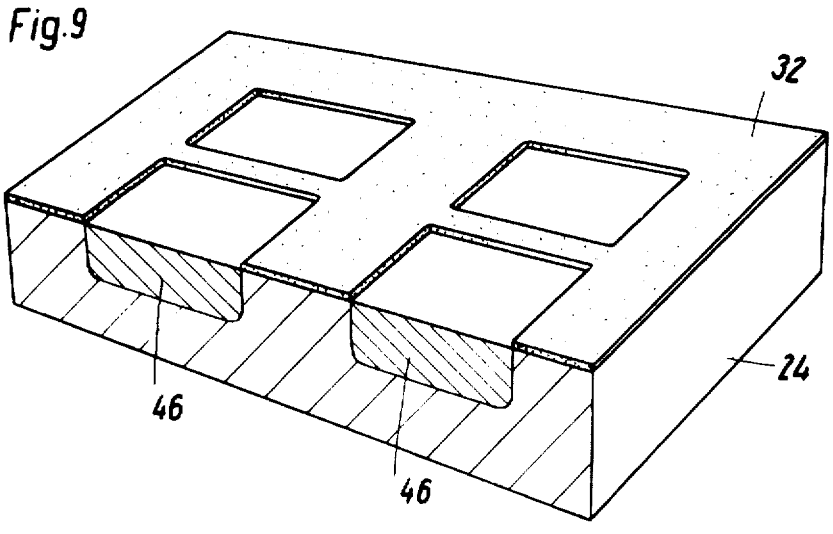
FIG. 9 is a view similar to FIG. 6, but showing a third production stage.

After the removal of the plastics layer 3, the recesses 45 are filled with epitaxially formed semiconductor material 46 as FIG. 9 shows. This epitaxial process takes place by a known technique in a suitable reaction chamber. The monocrystalline semiconductor material 46 grown in the recesses can be provided, by appropriate doping during the epitaxial deposition process, with a type of conductivity which is opposite to that of the semiconductor body 24 for example. Finally, components or semiconductor circuits indiffused by means of the known planar technique can be introduced into the individual semiconductor regions 46 thus insulated from one another by barrier layers. The semiconductor regions 46 may, of course, also have the same type of conductivity as the basic semiconductor body. The partial formation of epitaxial semiconductor regions as described is used, in particular, when a semiconductor material without an impurity gradient is required for the production of semiconductor components.

With the method described, particularly during the production of conducting paths, the plastics layer may also be left on the semiconductor body in many cases. Further metal layers for example may then be vapour-deposited on this plastics layer. In order to form a plurality of wiring planes, a second plastics layer may be sprayed over the first plastics layer and be used as a carrier for further metallic conducting paths or components.

The plastics layers of tetrafluoroethylene and polyurethane given by way of example as suitable for the new method are resistant to temperatures up to 200° C. and very resistant to acids so that the formation of disturbing cracks or even bursting of the plastics masking layer is out of the question.

The method described is particularly suitable for the production of integrated, monolithic semiconductor circuits produced by the planar technique, as well as for large circuits which consist of a plurality of individual circuits present in a semiconductor wafer and electrically interconnected by connecting paths.

Considerable portions of the semiconductor body have to be etched away for the production of mesa diodes and mesa transistors. The proposed masking method is excellently suited for carrying out these etching processes.

When carrying out the method according to the invention described in the examples, the oxide layers may, of course, be replaced by other insulating layers. The nature of the semiconductor body and its doping can be selected freely. The thickness of the plastics layer which is insensitive to light can be adapted to the particular requirements without difficulty.

It will be understood that the above description of the present invention is susceptible to various modifications, changes and adaptations.

What I claim as new and desire to secure by Letters Patent of the United States is:

1. A method of producing a semiconductor or thick film device, comprising the steps of providing a thin metallic layer on one surface of an insulating ceramic body with inserted semiconductor components, forming a layer of plastics material which is resistant to etching, temperature resistant, and insensitive to light on said thin metallic layer, guiding an electron beam over said plastics layer, controlling said beam so as to remove predetermined areas of said plastics layer for forming apertures in said plastics layer, and depositing further metal on the areas of said thin metal layer thus exposed until said apertures have been at least partially filled with said further metal.

2. A method of producing a semiconductor or thick film device comprising the steps of providing a thin metallic layer on one surface of an insulating glass body with inserted semiconductor components, forming a layer of plastics material which is resistant to etching, temperature resistant, and insensitive to light on said thin metallic layer, guiding an electron beam over said plastics layer, controlling said beam so as to remove predetermined areas of said plastics layer for forming apertures in said plastics layer, and depositing further metal on the areas of said thin metal layer thus exposed until said apertures have been at least partially filled with said further metal.

3. A method of producing a semiconductor or thick film device, comprising the steps of covering one surface of a semiconductor body, which contains at least one semiconductor component, with an insulating layer, forming contact-making windows in regions of said insulating layer which lie over regions of said semiconductor body which require contacts, providing a thin metallic layer on said insulating layer and on said semiconductor body in the contact-making windows, forming a layer of plastics material which is resistant to etching, temperature resistant, and insensitive to light on said thin metallic layer, guiding an electron beam over said plastics layer, controlling said beam so as to remove predetermined areas of said plastics layer for forming apertures in said plastics layer, and depositing further metal on the areas of said thin metal layer thus exposed until said apertures have been at least partially filled with said further metal, said further metal providing conducting paths and contacts for said semiconductor body.

4. A method as defined in claim 3, wherein said plastics layer is applied in a thickness about 1 μm. to a few tenths of a millimetre.

5. A method as defined in claim 4, wherein a layer of tetrafluoroethylene is used as said plastics layer.

6. A method as defined in claim 4, wherein a layer of polyurethane is used as said plastics layer.

7. A method as defined in claim 3, wherein said plastics layer is applied to said carrier body by spraying.

8. A method as defined in claim 3, wherein said further metal is electro-deposited.

9. A method as defined in claim 3, wherein said further metal is deposited without current.

10. A method as defined in claim 3, wherein an oxide layer is used as said insulating layer.

11. A method as defined in claim 3, wherein a nitride layer is used as said insulating layer.

12. A method as defined in claim 3, further comprising after said further metal deposition, removing said plastics layer with a solvent and removing the areas of said thin metal layer which have not had said further metal deposited thereon in an etching solution.

13. A method as defined in claim 3, wherein said the thin metal layer is applied to a thickness of about 500 to 1000 A. and channels about 5 to 10 μm. wide to receive the conducting paths are introduced into said plastics layer.

14. A method as defined in claim 3, further comprising controlling the cross-section, the intensity, the periodic rhythm and the movement of the electron beam by means of a programmed computer.

References Cited

UNITED STATES PATENTS

| | | | |
|---|---|---|---|
| 3,258,898 | 7/1966 | Garibotti | 219—121 EBM |
| 3,445,926 | 5/1969 | Medved | 29—578 |
| 3,549,432 | 12/1970 | Sivertsen | 29—577 |
| 3,574,014 | 4/1971 | Hugle | 29—580 |

JOHN F. CAMPBELL, Primary Examiner

W. TUPMAN, Assistant Examiner

U.S. Cl. X.R.

29—578, 589; 117—212; 156—2, 17; 204—15; 219—121, 384